United States Patent [19]
Dell et al.

[11] Patent Number: 6,065,093
[45] Date of Patent: May 16, 2000

[54] HIGH BANDWIDTH NARROW I/O MEMORY DEVICE WITH COMMAND STACKING

[75] Inventors: Timothy J. Dell, Colchester; Erik L. Hedberg; Mark W. Kellogg, both of Essex Junction, all of Vt.

[73] Assignee: International Business Machines Corporation, Armonk, N.Y.

[21] Appl. No.: 09/079,572

[22] Filed: May 15, 1998

[51] Int. Cl.⁷ .................................................. G06F 13/00
[52] U.S. Cl. ....................... 711/105; 711/104; 711/167; 710/107; 710/118
[58] Field of Search ..................... 711/105, 173, 711/104, 118, 140, 141, 149, 154, 167; 713/401; 710/107, 118

[56] References Cited

U.S. PATENT DOCUMENTS

| | | | |
|---|---|---|---|
| 4,228,500 | 10/1980 | Webster | 711/141 |
| 4,635,254 | 1/1987 | Tulpule et al. | 711/1 |
| 5,253,352 | 10/1993 | Olson | 710/107 |
| 5,329,630 | 7/1994 | Baldwin | 711/173 |
| 5,430,676 | 7/1995 | Ware et al. | 365/189.02 |
| 5,434,817 | 7/1995 | Ware et al. | 365/189.01 |
| 5,511,024 | 4/1996 | Ware et al. | 365/189.04 |
| 5,574,868 | 11/1996 | Marisetty | 710/118 |
| 5,586,299 | 12/1996 | Wakerly | 711/149 |
| 5,630,096 | 5/1997 | Zuravleff et al. | 711/154 |
| 5,655,113 | 8/1997 | Leung et al. | 713/501 |
| 5,751,655 | 5/1998 | Yamazaki et al. | 365/233 |
| 5,870,350 | 2/1999 | Bertin et al. | 365/233 |

FOREIGN PATENT DOCUMENTS

| | | | |
|---|---|---|---|
| 0 803 816 A2 | 10/1997 | European Pat. Off. | G06F 12/02 |
| 0 829 804 A2 | 3/1998 | European Pat. Off. | G06F 9/32 |

*Primary Examiner*—Do Hyun Yoo
*Assistant Examiner*—Than Nguyen
*Attorney, Agent, or Firm*—Whitham, Curtis & Whitham; Robert A. Walsh, Esq.

[57] ABSTRACT

A memory device is provided which stacks commands and internally executes each command at the appropriate time, thereby ensuring contiguous data I/O. The memory device is capable of initiating memory accesses either immediately or "stacking" the command along with a "clock count". The clock count defines the number of clock cycles that must occur prior to execution of the command by the memory device. The memory device initiates memory accesses either immediately, or delayed by the number of clocks defined by the clock count for that command. The memory device operates as a slave to the memory controller and therefore has no ability to execute instructions at a time other than that defined by the memory controller.

9 Claims, 4 Drawing Sheets

HIGH BANDWIDTH NARROW I/O MEMORY DEVICE WITH COMMAND STACKING

BACKGROUND OF THE INVENTION

1. Field of the Invention

The present invention generally relates to high bandwidth, narrow input/output (I/O) Dynamic Random Access Memories (DRAMs) and, more particularly, to a DRAM capable of stacking commands and self initiating execution of pending operations to provide continuous input/output data streams.

2. Description of the Related Art

Dynamic random access memory (DRAM) performance is a well known limitation to computer system performance. Processor speeds are rapidly outpacing main memory performance, with both processor designers and system manufacturers developing higher performance memory subsystems in an effort to minimize performance limitations due to the slower DRAM devices. Ideally, the memory performance would match or exceed processor performance, i.e., a memory cycle time would be less than one processor clock cycle. This is almost never the case and, so, the memory is a system bottleneck. For example, a state of the art high speed microprocessor may be based on a 333 MegaHertz (MHZ) clock with a 3 nanosecond (ns) clock period. A high performance synchronous DRAM (SDRAM) may have a 36 ns access time, which falls far short of processor performance.

This system bottleneck is exacerbated by the rise in popularity of multimedia applications. Multimedia applications demand several times more bandwidth for main memory or frame-buffer memory than computational intensive tasks such as spread sheet analysis programs or, other input/output (I/O) intensive applications such as word processing or printing.

Extended Data Out (EDO) and Synchronous DRAMs (SDRAMs) were developed to improve bandwidth. However, SDRAMs and EDO RAMs still do not match processor performance and, therefore, still limit system performance. Consequently, as faster microprocessors are developed for multimedia processing and high performance systems, faster memory architecture is being developed to bridge the memory/processor performance gap, e.g., wide I/O SDRAMs and double data rate (DDR) SDRAMs.

Recent developments predict a major turning point for memory devices and related subsystems with a shift to high speed/narrow I/O devices. These high bandwidth (data rate) DRAMs achieve the high data rate by accessing a large number of bits in an array, then multiplexing by 8:1 to achieve clocked data rates in excess of 500 MHZ.

High bandwidth architectures have been proposed for Dynamic Random Access Memories (DRAMs) that reduce chip pin count to nine pins by multiplexing input commands, addresses and data. For example, see U.S. Pat. No. 5,430,676 to Ware et al., entitled "Dynamic Random Access Memory System," U.S. Pat. No. 5,434,817 to Ware et al., entitled "Dynamic Random Access Memory System," and U.S. Pat. No. 5,511,024 to Ware et al., entitled "Dynamic Random Access Memory System."

In these high bandwidth DRAM architectures, commands are serially input on the nine pins at a 533 MHZ clock rate. Packets of control information called "Request Packets" are transferred to and stored in the DRAM during what is termed a transaction operation. After a pre-specified latency period, data is either input or output at a 533 MHZ transfer rate.

Request packets include a device, bank, and row address of a page to be activated, the column address of the first of eight bytes (an octo-byte) to be read, and a Data packet. A Data packet includes input data and data masking command.

Bus switching rates during these command or data transactions place stringent requirements on system bus net. Since all system communication and handshaking with the DRAM is through the nine bit bus, parallel system operations become difficult. Although the high bandwidth architecture may provide a faster data transfer rate than other high bandwidth RAM alternatives, bus contentions and bus blocking may result to reduce overall system performance and prevent seamless data transfers.

To maintain a seamless data I/O it would be necessary to issue commands early, which is not permitted in current devices. However, doing so would likely result in an unknown condition on the data bus or in issuing data out of order.

SUMMARY OF THE INVENTION

It is therefore an object of the present invention to provide a high bandwidth DRAM device having a separate command bus and a separate data bus.

It is yet another object of the present invention to provide a memory that is capable of stacking commands and self-initiating execution of pending operations to ensure that the lowest possible access latency is always available.

According to the invention, a memory device is provided which stacks commands and internally executes each command at the appropriate time, thereby ensuring contiguous data I/O. The memory device is capable of initiating memory accesses either immediately or "stacking" the command along with a "clock count". The clock count defines the number of clock cycles that must occur prior to execution of the command by the memory device. The memory controller tracks all accesses to all chips, to ensure that no data bus contention occurs. The memory device initiates memory accesses either immediately, or delayed by the number of clocks defined by the clock count for that command as defined by the memory controller. The DRAM operates as a slave to the memory controller and therefore has no ability to execute instructions at a time other than that defined by the memory controller. The memory device permits both "early" or "just-in-time" receipt of memory commands to the DRAM for read operations and memory commands and data for write operations. Further, no external wires or handshaking signals are required to communicate a busy state between the DRAMs and/or the memory controller.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
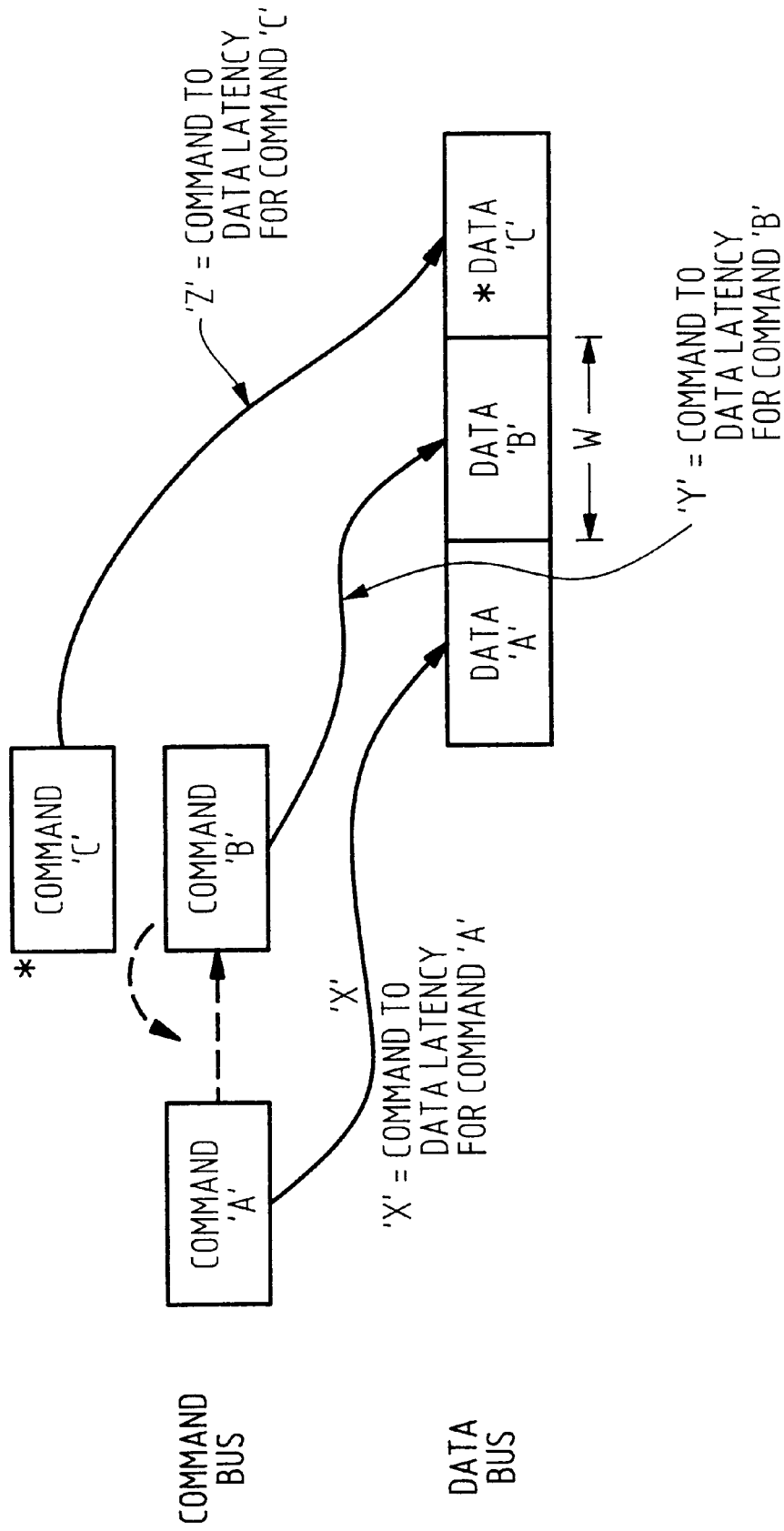
FIG. 1 is a block diagram showing a sequence of read commands and the associated data for each.

Referring now to the drawings, and more particularly to FIG. 1, there is shown a sequence of read commands and the associated data for each. X, Y, and Z represent command-to-data latency. To maintain a continuous data (Data A–>Data B–>Data C), it would be necessary to issue Command B early, which is not permitted with current devices. In other words, the varying command-to-data latencies will sometimes result in the desire to issue more than one command at a time if the data bus is to be kept as close to 100% utilization as possible. In the example shown in FIG. 1, since the command "C" has a longer latency period than command "B", it is desirable to issue commands "B" and "C" simultaneously to ensure that the entire data bus is utilized to capacity. The worst case condition is where Y+W=Z (in clocks), since in this case commands "B" and "C" must be sent simultaneously.

Hence, according to this invention, Command B could be issued early and stacked with its clock count, with command C issued at its normal time. The memory device then internally executes each command at the appropriate time, thereby ensuring contiguous data.

The memory device is expected to perform at least the following conventional functions:

a) Access to a closed bank (either a write or read), with the memory in standby. Leaving a new page in an open state upon completion. This operation requires both a row and column access.

b) Access to an open bank, either write or read, then leaving the page in an open state. This operation requires only a column access.

c) Access to a closed bank, either a write or read, then closing the page that was just accessed (leaving the array closed). This operation requires both a row and column access, as well as a row "precharge" operation to close the bank.

d) Access to an open bank, either write or read, then closing the page that was just accessed (leaving the array closed). This operation requires a column address and a row precharge.

e) Access to an open bank when the wrong page is open, thereby requiring the original page to be closed (precharged), and the new page to be opened (leaving the array opened). This operation requires a row precharge, and a new row and column access.

Figure 2:
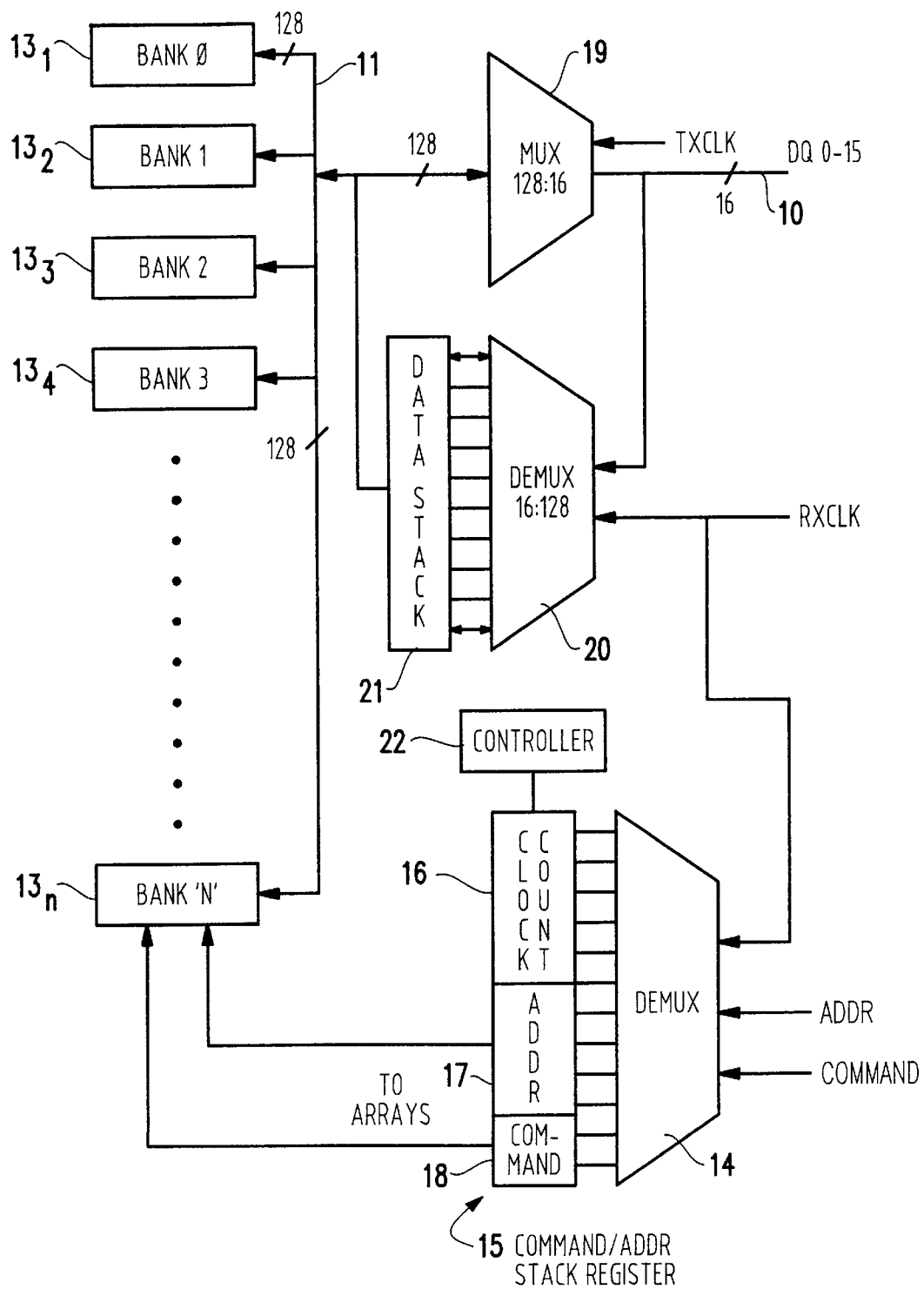
FIG. 2 is a block diagram of a high-bandwidth memory device according to the present invention.

Referring now to FIG. 2, there is shown a memory device according to the present invention. The memory device has a narrow I/O bus 10, and a wide internal bus 11 to several sub-arrays $13_i$–$13_n$ labeled BANK O-BANK N. For example, as shown, the narrow I/O bus 10 is 16-bits wide, the wide internal bus is 128-bits wide. There may be sixteen sub-arrays 13. Of course the number of sub-arrays 13 may be more or less than sixteen depending on performance and chip size tradeoffs. Commands and addresses are issued to demultiplexer (DEMUX) 14 along with the system clock signal RXCLK. The memory further includes a command/address stack register 15. The command/address stack register 15 comprises a clock count register 16, an address register 17, and a command register 18. Each of the registers 15, 16, and 17 are made up of many sub-registers for storing a plurality of stacked commands and corresponding addresses and clock counts. Commands and corresponding addresses for tasks to be performed in the future are stored in the command register 18 and address register 17, respectively. Similarly, a clock count that indicates a delay time when a corresponding command is to be performed by the sub-arrays 13 is stored in the clock count register 16. A controller 22 decrements the clock counts and initiates the corresponding command within the sub-arrays 13 when the clock count is zero. For read operations, a 128:16 multiplexer (MUX) 18 is provided to route data from the sub-arrays 13 to data I/O pins DQ0–DQ15. Similarly, a 16:128 demultiplexer (DMUX) 20 receives write data from the I/O pins DQ0–DQ15 as well as the system clock signal RXCLK. In cases where write commands are stacked, a data stacking register 21 is included to hold the data associated with the write operation that is to be stacked. Note that it is not necessary for write data to be stacked for it to be sent simultaneously with a corresponding write command stored in the command register 15. In the simplest implementation, the command and data registers, 18 and 21, can be combined, and include the following fields:

| Combined Stacked Command & Data Register | | | |
|---|---|---|---|
| Valid Flag | Command Bits | Write Data Bits | Wait State in clock counts |
| operation #1 | | | |
| 2 | | | |
| n | | | |

The definition of each field is as follows:

Valid Flag: Describes whether the information in that register location is valid (i.e., a pending command), or invalid (i.e., includes either a command that has been completed or meaningless data). At the completion of any access (i.e. the entire command has been executed, including any data transfers), the "Valid Flag" is set to a "0" state to indicate that no valid command exists in that register location. In the preferred implementation, this register would be 1 bit in width (1=Valid, 0=invalid).

Command Bits: Contains a representation of the command and address sequence that is to be completed (in the preferred embodiment, this sequence is identical to the command sequence received by the device). For example, for a device with a 13 bit command bus width, and include 4 clocks of information, the register would be 13×4=52 bits. Of course the command bits and address bits can be split into different registers if desired.

Write Data Bits: The data to be written into the memory device. As indicated earlier, a simpler implementation may elect not to stack write operations. For example, for a device with an 18 bit data bus width, that operates as a burst of 8, the register would be 18×8=144 bits.

Wait State in Clock Counts: Defines the number of clocks to be counted prior to the memory device initiating the command. In the preferred embodiment, all entries in this column are decremented once for every valid clock, i.e., any clock that is not masked by commands that halt device operation, such as clock "mask" on a JEDEC-compatible SDRAM (Joint Electron Device Engineering Council).

For "Read" operations, the memory controller would consider the data transfer period (4 clocks for a burst of 8, in this embodiment) thereby ensuring that no data collisions occur. For example, for a device a having commands that may require up to 32 clocks to be completed, this register would have at least 5 bits (i.e., allowing up to 32 clocks to be counted prior to resetting the "Valid" flag).

The following table describes a subset of commands that would be permitted with a high speed/narrow I/O device as described in this invention. For each of the commands, a typical "latency" has been defined which might apply to devices based on 64 Mb technology:

| Operation | Latency (ns) | Time (# of clocks) |
|---|---|---|
| clock cycle time | 4 ns | 1 clock |
| Read Burst of 8 | 16 ns | 4 clocks |
| Read Access time a: closed bank | 48 ns | 12 clocks |
| Read Access time b: page hit | 18 ns | 4.5 clocks |
| Read Access time e: page miss | 76 ns | 19 clocks |

The "Access Time" entries include only the time associated with the completion of the internal array operations and do not include either the command transfer time, or the time associated with the actual transfer of data (on a 'read'). In the preferred embodiment, the values in the "Latency Time" column would be identical to those that would be stored in the "Wait State Count" register.

Figure 3:
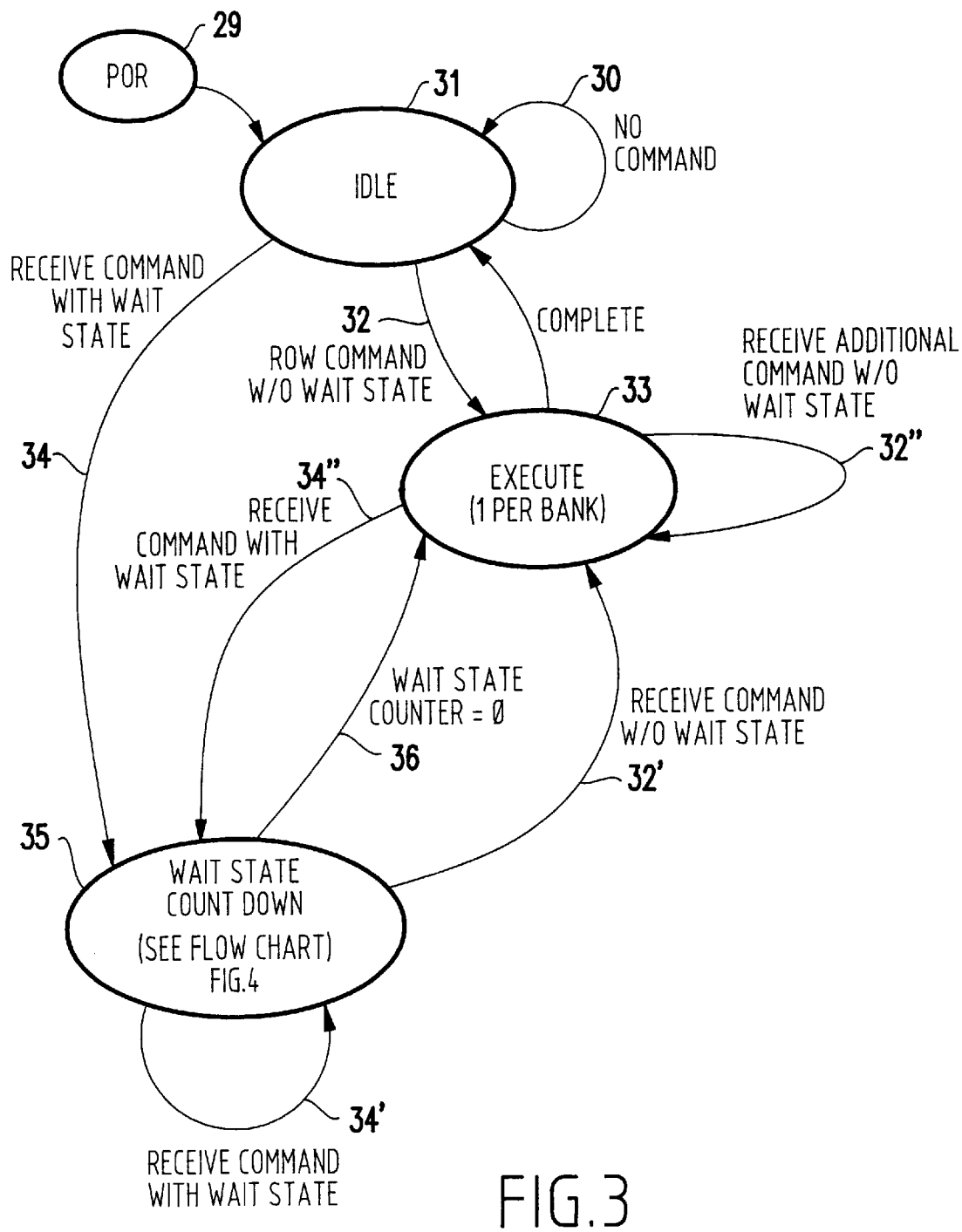
FIG. 3 is a state diagram showing the states of the memory device.

Referring now to FIG. 3, there is shown a state diagram graphically illustrating the operation of the command stacking memory device as shown in FIG. 2. At power-on-reset (POR) 29 the memory device is powered up and initiated to enter the idle state 31. In this state, one of two things can happen. That is, either command can be received with no wait state 32, in which case the controller instructs the memory to execute the command 33, or a command is received with a wait state to be executed at some time in the future 34. In this case, the command and the "clock count" indicating when the command is to be executed are stacked and a wait state countdown begins 35. When the wait state countdown is equal to zero 36, the stacked command is executed. Similarly, just as above, during any of the three states illustrated, idle 31, execute 33, or wait state countdown 35, one of two things can happen. Either a command can be received with no wait state 32, in which case the controller instructs the memory to execute the command 33, or a command is received with a wait state to be executed at some time in the future 34.

Figure 4:
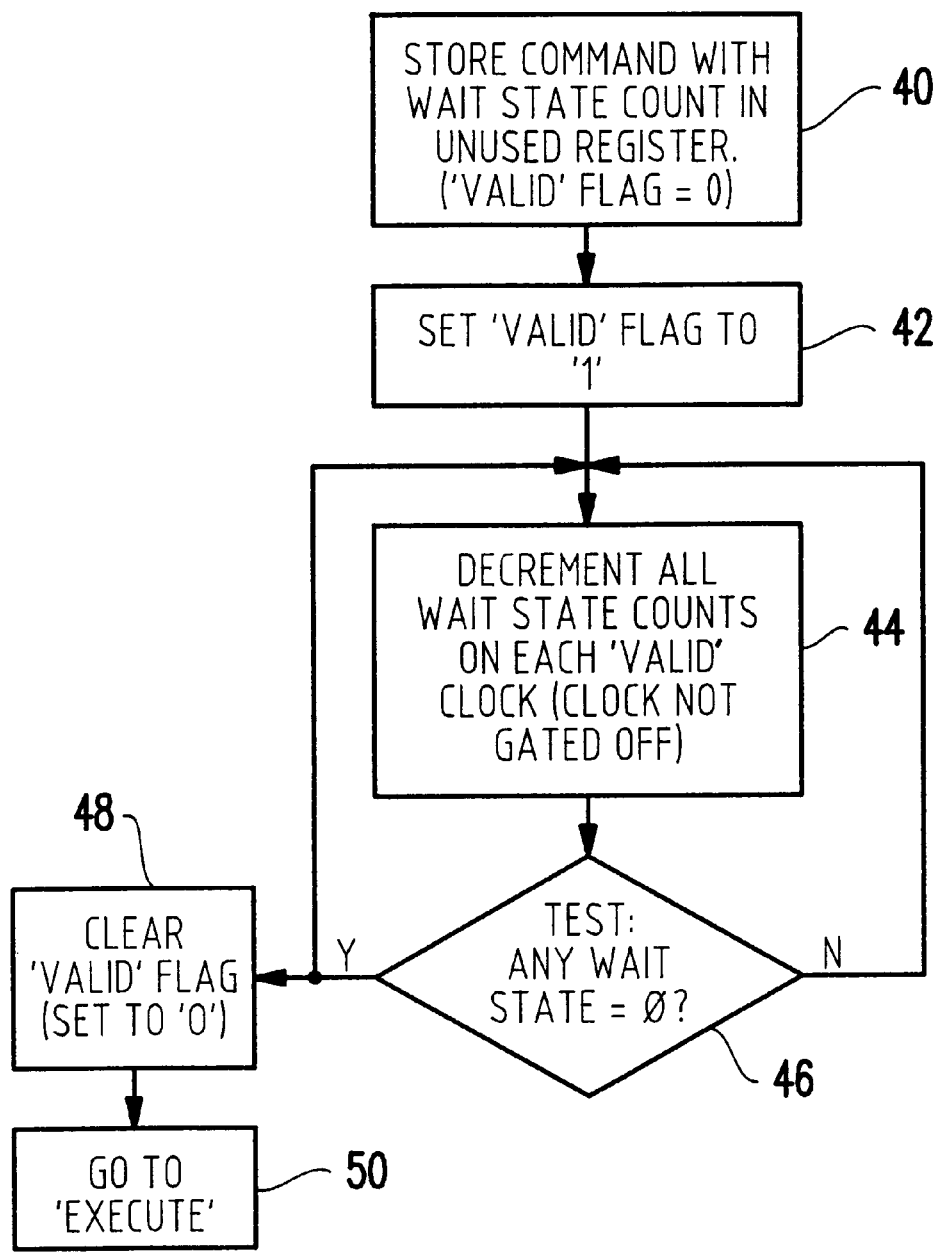
FIG. 4 is a flow diagram for the wait state countdown state shown in FIG. 3.

Referring now to FIG. 4, there is shown a flow diagram illustrating in detail the wait state countdown 35 shown in FIG. 3. Beginning with block 40, a command is stored in an unused (i.e., invalid flag) register along with its clock count indicating when in the future the command is to be executed. In block 42 the flag for that register is set to "1" indicating that a valid command is stored therein. The wait state is decremented for each valid clock 44. At decision block 46, it is determined if any wait state is equal to zero. If no wait state is equal to zero, the wait states for each valid clock continues to be decremented. When a particular valid wait state clock is determined to equal zero, the valid flag is set to "0" (i.e., invalid) and the stacked command is executed.

Thus according to the present invention, the memory controller stacks commands and internally executes each command at the appropriate time based on a clock count, thereby ensuring contiguous data I/O. While the invention has been described in terms of a single preferred embodiment, those skilled in the art will recognize that the invention can be practiced with modification within the spirit and scope of the appended claims.

We claim:

1. A memory device, comprising:

a command stack comprising a plurality of command registers for stacking a plurality of memory commands;

a clock stack comprising a plurality of clock registers, each of said clock registers for storing a clock count corresponding to a particular command stored in one of said command registers; and a controller for decrementing each of said plurality of clock registers by one for each successive clock of said controller, said controller initiating any of said commands when said corresponding clock count is zero.

2. A memory device as recited in claim 1, further comprising a write data stack comprising a plurality of write data registers for storing write data corresponding to a write command stored in said command register.

3. A memory device as recited in claim 1 further comprising a flag register comprising a plurality of flag registers for indicating whether a corresponding command register comprises a valid command.

4. A high bandwidth memory with command stacking, comprising:

a plurality of multiple bank synchronous memory devices connected to a first bus;

a multiplexer for routing read data between said first bus and a narrower second bus connected to a plurality of data I/O pins;

a first demultiplexer for routing write data between said first bus and said second narrower bus;

a second demultiplexer connected to receive a system clock and memory commands for controlling functions of said plurality of multiple bank synchronous memory devices, each of said commands comprising a corresponding clock count indicating a number of system clocks that must pass before said command is executed by said plurality of multiple bank synchronous memory devices; and a command stacking register for storing said commands and said corresponding clock count, said corresponding clock count being decremented by one for each said system clock, wherein said command is forwarded to one the of multiple bank synchronous memory devices identified by an address associated with a stored command for execution when said corresponding clock count is equal to zero.

5. A high bandwidth memory with command stacking as recited in claim 4 wherein said command stacking register comprises:

a command register for stacking a plurality of said commands;

a clock count register for stacking said clock count corresponding to each of said commands; and an address register for stacking an address within said plurality of multiple bank synchronous memory devices corresponding to each of said commands.

6. A high bandwidth memory with command stacking as recited in claim 4 further comprising a data stack register connected between said first demultiplexer and said first bus for storing write data corresponding to a command stored in said command stack register.

7. A method for stacking commands and self initiating execution of pending operations in a memory, comprising the steps of:

stacking a plurality of memory commands in command registers, said memory commands to be executed at a future time;

storing a clock count corresponding to each of said memory commands;

decrementing each of said plurality of clock counts by one for each successive memory clock cycle; and initiating any of said commands when said corresponding clock count is zero to execute an operation in the memory.

8. A method for stacking commands and self initiating execution of pending operations in a memory as recited in claim 7, further comprising the step of storing a flag associated with each of said plurality of commands to indicate if said command is a valid command.

9. A method for stacking commands and self initiating execution of pending operations in a memory as recited in claim 7, further comprising the step of stacking a write data with a write command wherein said write data is written to said memory when said corresponding clock count is zero.

* * * * *